United States Patent
Ou et al.

(10) Patent No.: US 10,483,950 B2
(45) Date of Patent: Nov. 19, 2019

(54) LEVEL CONVERSION DEVICE AND METHOD

(71) Applicant: TAIWAN SEMICONDUCTOR MANUFACTURING CO., LTD., Hsinchu (TW)

(72) Inventors: Yu-Lun Ou, Hsinchu (TW); Wei-Chih Hsieh, Taoyuan (TW); Shang-Chih Hsieh, Taoyuan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/410,886

(22) Filed: May 13, 2019

(65) Prior Publication Data

US 2019/0280678 A1 Sep. 12, 2019

Related U.S. Application Data

(63) Continuation of application No. 16/219,525, filed on Dec. 13, 2018, now Pat. No. 10,291,210, which is a (Continued)

(51) Int. Cl.
*H03K 3/356* (2006.01)

(52) U.S. Cl.
CPC ....... *H03K 3/356* (2013.01); *H03K 3/356104* (2013.01)

(58) Field of Classification Search
CPC ... H03K 19/018507; H03K 3/356; H03L 5/00
(Continued)

(56) References Cited

U.S. PATENT DOCUMENTS

| 5,378,932 A | 1/1995 | Shin et al. |
| 6,633,192 B2 | 10/2003 | Tsuchiya |

(Continued)

FOREIGN PATENT DOCUMENTS

| DE | 10 2014 214 820 A1 | 2/2015 |
| EP | 1 079 524 A1 | 2/2001 |

(Continued)

OTHER PUBLICATIONS

Kim, Y., "SLC: Split-Control Level Converter for Dense and Stable Wide-Range Voltage Conversion," 2012 Proceedings of the ESSCIRC (ESSCIRC), 2012, pp. 478-481.

(Continued)

*Primary Examiner* — Tomi Skibinski
(74) *Attorney, Agent, or Firm* — Maschoff Brennan

(57) ABSTRACT

A device is disclosed that includes a level shifter and an output stage. The level shifter is configured to output a first output signal at a first output terminal in response to a first input signal having a first logic level, and is configured to output a second output signal at a second output terminal in response to the first input signal having a second logic level. The output stage is configured to receive and adjust the first output signal or the second output signal that is selected in response to the first input signal, and configured to generate a third output signal, wherein the third output signal has a logic value that is the same as a logic value of the first output signal or the second output signal.

20 Claims, 10 Drawing Sheets

Related U.S. Application Data continuation of application No. 15/851,403, filed on Dec. 21, 2017, now Pat. No. 10,164,615, which is a continuation of application No. 14/942,909, filed on Nov. 16, 2015, now Pat. No. 9,866,205.

(58) Field of Classification Search
USPC .......................................... 327/333; 326/80
See application file for complete search history.

(56) References Cited

U.S. PATENT DOCUMENTS

| | | | |
|---|---|---|---|
| 7,880,501 B2 | 2/2011 | Han et al. | |
| 2007/0115041 A1 | 5/2007 | Tachibana et al. | |
| 2009/0027102 A1 | 1/2009 | Fayed | |
| 2009/0315610 A1* | 12/2009 | Han | G09G 3/3696 327/333 |
| 2010/0103748 A1* | 4/2010 | Kim | G11C 7/1078 365/189.05 |
| 2013/0162294 A1 | 6/2013 | Henmi et al. | |
| 2014/0266386 A1* | 9/2014 | Huang | H03K 3/012 327/333 |
| 2015/0035563 A1 | 2/2015 | Nazemi et al. | |

FOREIGN PATENT DOCUMENTS

| | | |
|---|---|---|
| JP | 3603769 B2 | 12/2004 |
| JP | 2011-172065 A | 9/2011 |
| KR | 10-2010-0000140 A | 1/2010 |

OTHER PUBLICATIONS

Lutkemeier, S., and Ruckert, U., "A subthreshold to above-threshold level shifter comprising a wilson current mirror," IEEE Transactions on Circuits and Systems II: Express Briefs, vol. 57, No. 9, Sep. 2010, pp. 721-724.

Osaki, Y., et al., "A low-power level shifter with logic error correction for extremely low-voltage digital CMOS LSIs," IEEE Journal of Solid-State Circuits, vol. 47, No. 7, Jul. 2012, pp. 1776-1783.

Shao, H., and Tsui, C.-Y.,"A robust, input voltage adaptive and low energy consumption level converter for sub-threshold logic," 33rd European Solid State Circuits Conference, 2007, ESSCIRC 2007, pp. 312-315.

Wooters, S.N., et al., "An energy-efficient subthreshold level converter in 130-nm CMOS," IEEE Transactions on Circuits and Systems II: Express Briefs, vol. 57, No. 4, Apr. 2010, pp. 290-294.

* cited by examiner

LEVEL CONVERSION DEVICE AND METHOD

RELATED APPLICATIONS

This application is a continuation of the U.S. application Ser. No. 16/219,525, filed Dec. 13, 2018, now U.S. Pat. No. 10,291,210, issued on May 14, 2019, which is a continuation of U.S. application Ser. No. 15/851,403, filed Dec. 21, 2017, now U.S. Pat. No. 10,164,615, issued Dec. 25, 2018, which is a continuation of U.S. application Ser. No. 14/942,909, filed Nov. 16, 2015, now U.S. Pat. No. 9,866,205, issued Jan. 9, 2018, all of which are herein incorporated by reference.

BACKGROUND

With rapid development of manufacturing process technology, low power design has been widely utilized in many applications. For example, level shifters are generally used to interface voltage signals between diversely different circuits that operate with different power voltages from each other. However, when operating at a lower power voltage, for example, a sub-threshold voltage, the operations of the level shifter are failed due to leakage currents.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
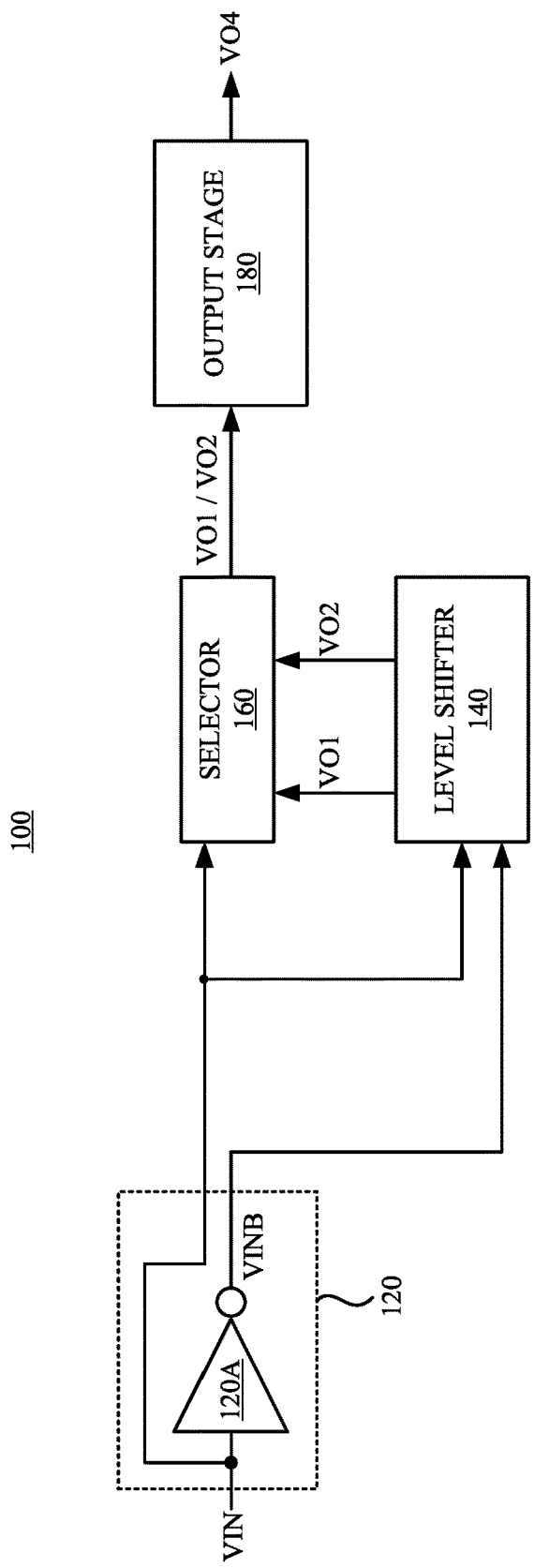
FIG. 1 is a schematic diagram of a device, in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

FIG. 1 is a schematic diagram of a device 100, in accordance with various embodiments of the present disclosure. In some embodiments, the device 100 is implemented in a level converter or as a level converter.

As illustratively shown in FIG. 1, the device 100 includes an input signal generator 120, a level shifter 140, a selector 160, and an output stage 180. For illustration, the input signal generator 120 includes an inverter 120A. The input signal generator 120 is configured to input an input signal VIN, and further output an input signal VINB, by the inverter 120A, in response to the input signal VIN. In other words, in some embodiments, the input signal VIN is an inverse of the input signal VINB. In some embodiments, the input signal VINB is a phase shift of the input signal VIN. In some embodiments, the input signal VINB is generated by a logical or arithmetical operations of the input signal VIN.

The level shifter 140 is configured to adjust the voltage level of the input signal VIN to generate an output signal VO1 and an output signal VO2. For illustration, the maximum voltage of the voltage level of the input signal VIN is set to a voltage VDDI. The level shifter 140 is able to adjust the maximum voltage of the input signal VIN from the voltage VDDI to a voltage VDDO, in which the voltage VDDO is different from the voltage VDDI.

The selector 160 is configured to transmit one of the output signal VO1 and the output signal VO2 to the output stage 180 according to the input signals VIN and VINB. The output stage 180 is configured to adjust the voltage swing of the one of the output signal VO1 and the output signal VO2 transmitted from the selector 160, in order to generate an output signal VO4. In some embodiments, the output stage 180 includes one or more buffers that pull the voltage swing of one of the output signals VO1 and VO2 to full range, to generate the output signal VO4. Effectively, the driving ability of the device 100 is increased by the output stage 180. For illustration, the full range of the voltage swing is configured from a voltage VSS which is, for example, a ground voltage, to the voltage VDDO which is, for example, a power voltage.

In some embodiments, the input signal generator 120 operates with the voltage VDDI, while the level shifter 140, the selector 160, and the output stage 180 operate with the voltage VDDO. In some embodiments, the voltage VDDI is lower than or equal to the voltage VDDO. For example, the voltage VDDI ranges from about 0.2 Volts to about 1.2 Volts, and the voltage ranges VDDO is about 1.2 Volts. Alternatively, in some other embodiments, the voltage VDDI is higher than or equal to the voltage VDDO. For example, the voltage VDDI is about 1.2 Volts, and the voltage VDDO ranges from about 0.2 Volts to about 1.2 Volts. In other words, in some embodiments, the level shifter 140 is able to pull up the voltage level of the input signal VIN to a higher voltage. Alternatively, in some embodiments, the level shifter 140 is able to pull down the voltage level of the input signal VIN to a lower voltage.

The arrangements of the voltage VDDI and the voltage VDDO are given for illustrative purposes. Various arrangements of the voltage VDDI and the voltage VDDO are within the contemplated scope of the present disclosure.

Figure 2:
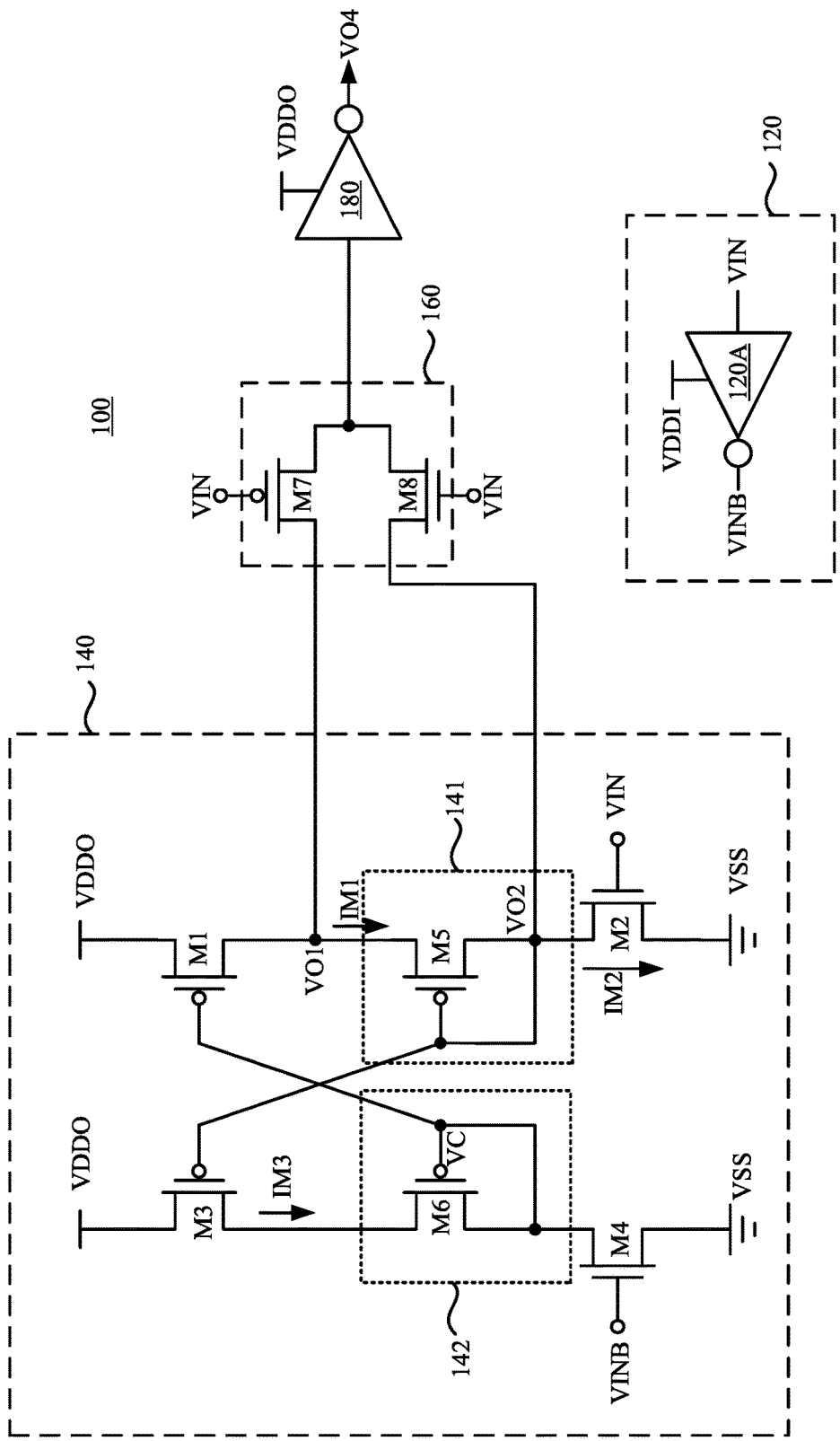
FIG. 2 is a circuit diagram of the device in FIG. 1, in accordance with various embodiments of the present disclosure.

Reference is now made to FIG. 2. FIG. 2 is a circuit diagram of the device 100 in FIG. 1, in accordance with various embodiments of the present disclosure.

In some embodiments, the level shifter 140 includes switches M1-M4 and current limiters 141 and 142. The level shifter 140 generates the output signal VO1 at a first terminal of the current limiter 141, and generates the output signal VO2 at a second terminal of the current limiter 141.

For illustration, a first terminal of the switch M1 is configured to receive the voltage VDDO, a second terminal of the switch M1 is coupled to the first terminal of the current limiter 141, and a control terminal of the switch M1 is coupled to a second terminal of the current limiter 142 and receives a control signal VC. A first terminal of the switch M2 is coupled to the second terminal of the current limiter 141, a second terminal of the switch M2 is configured to receive the voltage VSS, and a control terminal of the switch M2 is configured to receive the input signal VIN. A first terminal of the switch M3 is configured to receive the voltage VDDO, a second terminal of the switch M3 is coupled to a first terminal of the current limiter 142, and a control terminal of the switch M3 is coupled to the second terminal of the current limiter 141 to receive the output signal VO2. A first terminal of the switch M4 is coupled to the second terminal of the current limiter 142, a second terminal of the switch M4 is configured to receive the voltage VSS, and a control terminal of the switch M4 is configured to receive the input signal VINB. In some embodiments, the voltage VSS is lower than the voltage VDDO.

In some embodiments, the switches M1 and M3 operate as pulling-up units of the level shifter 140. For illustration, when the switch M1 is turned on by the control signal VC, the voltage level of the first terminal of the current limiter 141 is thus pulled up to the voltage VDDO through the switch M1. Accordingly, the first terminal of the current limiter 141 generates the output signal VO1 corresponding to the pulled up voltage level. When the switch M3 is turned on by the output signal VO2, the voltage level of the first terminal of the current limiter 142 is pulled up to the voltage VDDO through the switch M3.

Corresponding to the switches M1 and M3, the switches M2 and M4 operate as pulling-down units of the level shifter 140. For illustration, when the switch M2 is turned on by the input signal VIN, the voltage level of the second terminal of the current limiter 141 is pulled down to the voltage VSS through the switch M2. When the switch M4 is turned on by the input signal VINB, the voltage level of the second terminal of the current limiter 142 is pulled down to the voltage VSS. Accordingly, the second terminal of the current limiter 142 generates the control signal VC corresponding to the pulled down voltage level.

With the arrangements for the switches M1-M4, a self-control mechanism is implemented in the level shifter 140. Detailed operations are described below with reference to FIG. 3 and FIG. 4.

In some approaches without using the current limiters 141 and 142, when the input signal VIN is a sub-threshold voltage having, for example, a voltage level of about 0.2 Volts, the switch M1 and the switch M2 are turned on at the same time. In such a condition, if a current IM1 flowing from the switch M1 to the switch M2 is greater than a current IM2 flowing through the switch M2, the pulling-down operation of the switch M2 is failed. Effectively, the operations of the level shifter 140 are failed. Based on the above, the device in these approaches cannot be operated with a sub-threshold voltage.

Compared with the aforementioned approaches, in some embodiments, the current limiter 141 is utilized to reduce the current IM1 flowing from the switch M1 to the switch M2, and the current limiter 142 is utilized to reduce a current IM3 flowing from the switch M3 to the switch M4. Alternatively stated, the current limiter 141 is configured to generate a voltage drop between the switches M1 and M2, in which the voltage drop is sufficient to reduce the current IM1. The current limiter 142 is configured to generate a voltage drop between the switches M3 and M4, in which the voltage drop is sufficient to reduce the current IM3. With such arrangements, the switch M2 is able to pull down the voltage level of the second terminal of the current limiter 141 to the voltage VSS when the input signal VIN is a low voltage, for example, the sub-threshold voltage.

In some embodiments, the current limiter 141 and the current limiter 142 are resistive devices. In various embodiments, the current limiter 141 and the current limiter 142 are diodes. In further embodiments, the diodes for implementing the current limiter 141 and the current limiter 142 are formed with various types of transistors. For illustration, as shown in FIG. 2, the current limiter 141 includes a diode-connected metal-oxide-silicon field-effect transistor (MOSFET) M5, and the current limiter 142 includes a diode-connected MOSFET M6. Effectively, the diode-connected MOSFET M5 provides the voltage drop, i.e., the threshold voltage of the diode-connected MOSFET M5, between the switches M1 and M2. The diode-connected MOSFET M6 also provides a voltage drop, i.e., the threshold voltage of the diode-connected MOSFET M6, between the switches M3 and M4. As a result, the current IM1 flowing toward the switch M2 and the current IM3 flowing toward the switch M4 are reduced.

The configurations of the current limiters 141 and 142 are given for illustrative purposes. Various configurations of the current limiters 141 and 142 are within the contemplated scope of the present disclosure.

With continued reference to FIG. 2, in some embodiments, the selector 160 includes switches M7 and M8. The switch M7 is coupled between the first terminal of the current limiter 141 and the output stage 180. The switch M7 is configured to be turned on according to the input signal VIN, to transmit the output signal VO1 from the first terminal of the current limiter 141 to the output stage 180. The switch M8 is coupled between the second terminal of the current limiter 141 and the output stage 180. The switch M8 is configured to be turned on according to the input signal VIN, to transmit the output signal VO2 from the second terminal of the current limiter 141 to the output stage 180.

Figure 3:
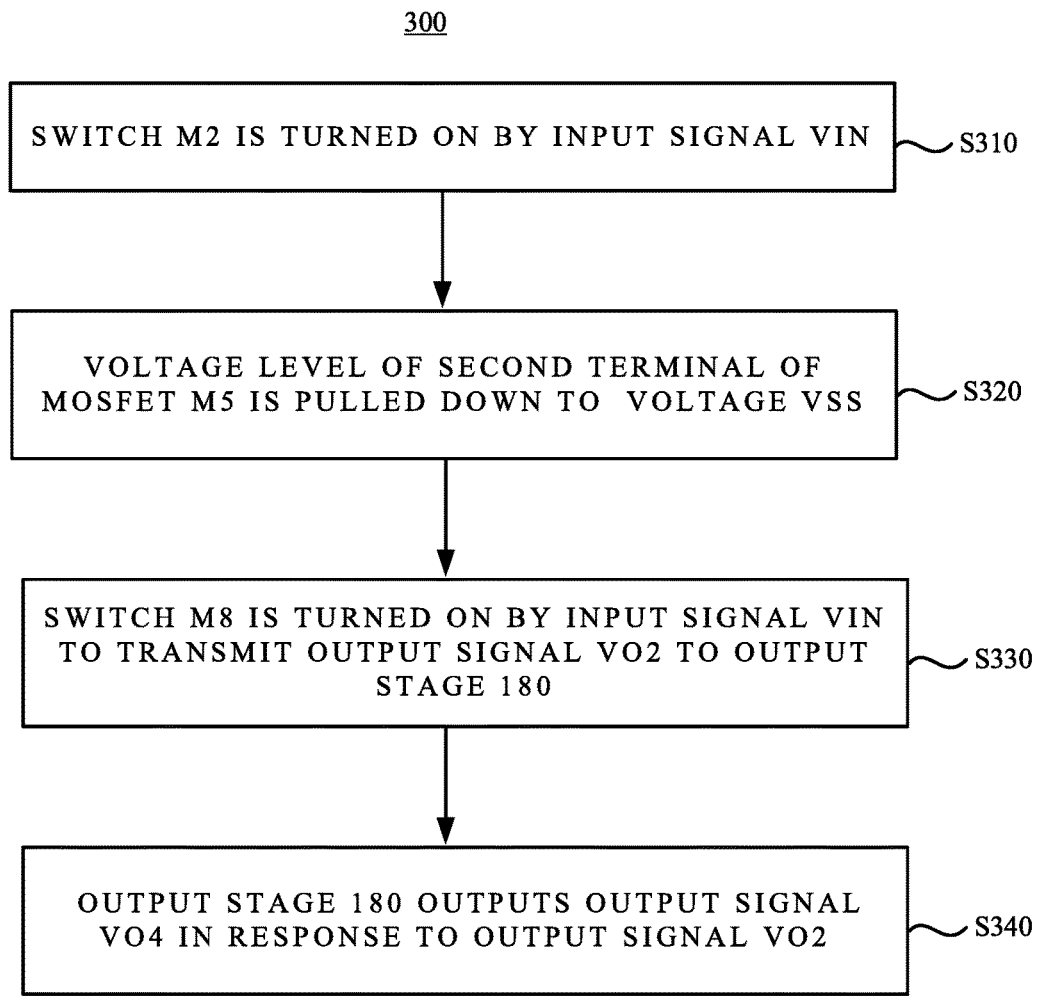
FIG. 3 is a flow chart of operations of the device in FIG. 2 when the input signal VIN has a logic value of 1, in accordance with various embodiments of the present disclosure.

Reference is now made to both of FIG. 2 and FIG. 3. FIG. 3 is a flow chart 300 of operations of the device 100 in FIG. 2 when the input signal VIN has a logic value of 1, in accordance with various embodiments of the present disclosure.

In various embodiments, the input signal VIN is able to have a logic value of 1 or 0. As shown in FIG. 3, operations of the device 100 in FIG. 2 are described with respect to the input signal VIN having a logic value of 1.

In operation S310, the switch M2 is turned on by the input signal VIN. In operation S320, the voltage level of the second terminal of the MOSFET M5 is pulled down to the voltage VSS. Accordingly, the output signal VO2 corresponding to the pulled down voltage level of the second terminal of the MOSFET M5 is generated. In operation S330, the switch M8 is turned on by the input signal VIN to transmit the output signal VO2 to the output stage 180. In operation S340, the output stage 180 outputs the output signal VO4 in response to the output signal VO2.

In some embodiments, the voltage swing of the input signals VIN and VINB ranges from the voltage VSS to the voltage VDDI, in which the voltage VSS corresponds to the logic value of 0, and the voltage VDDI corresponds to the logic value of 1. For illustration, as shown in FIG. 2, when the input signal VIN has the logic value of 1, the input signal VINB accordingly has the logic value of 0. The switch M2 is thus turned on by the input signal VIN. Accordingly, the voltage level of the second terminal of the MOSFET M5 is pulled down to the voltage VSS, in order to generate the output signal VO2 having the level of the voltage VSS. The voltage level of the first terminal of the MOSFET M5 is then transited to the voltage VSS+VTH5 through the diode-connected MOSFET M5, in which VTH5 is a threshold voltage of the MOSFET M5. Furthermore, the switch M8 is turned on by the input signal VIN to transmit the output signal VO2 to the output stage 180. The output stage 180 generates the output signal VO4 having the logic value of 1 according to the output signal VO2.

As described above, in the operations S310-S340 illustrated above, the diode-connected MOSFET M5 provides a voltage drop i.e., the threshold voltage of the MOSFET M5, between the switches M1 and M2. In other words, the diode-connected MOSFET M5 effectively operate as a resistive device between the switches M1 and M2, to provide a resistance to reduce the current flowing from the switch M5 to the switch M2, compared to the approaches using no current limiter. With such arrangements, the current IM1 flowing from the switch M1 to the switch M2 is reduced. As a result, the pulling down operation of the switch M2 is able to be performed with a sub-threshold voltage.

Figure 4:
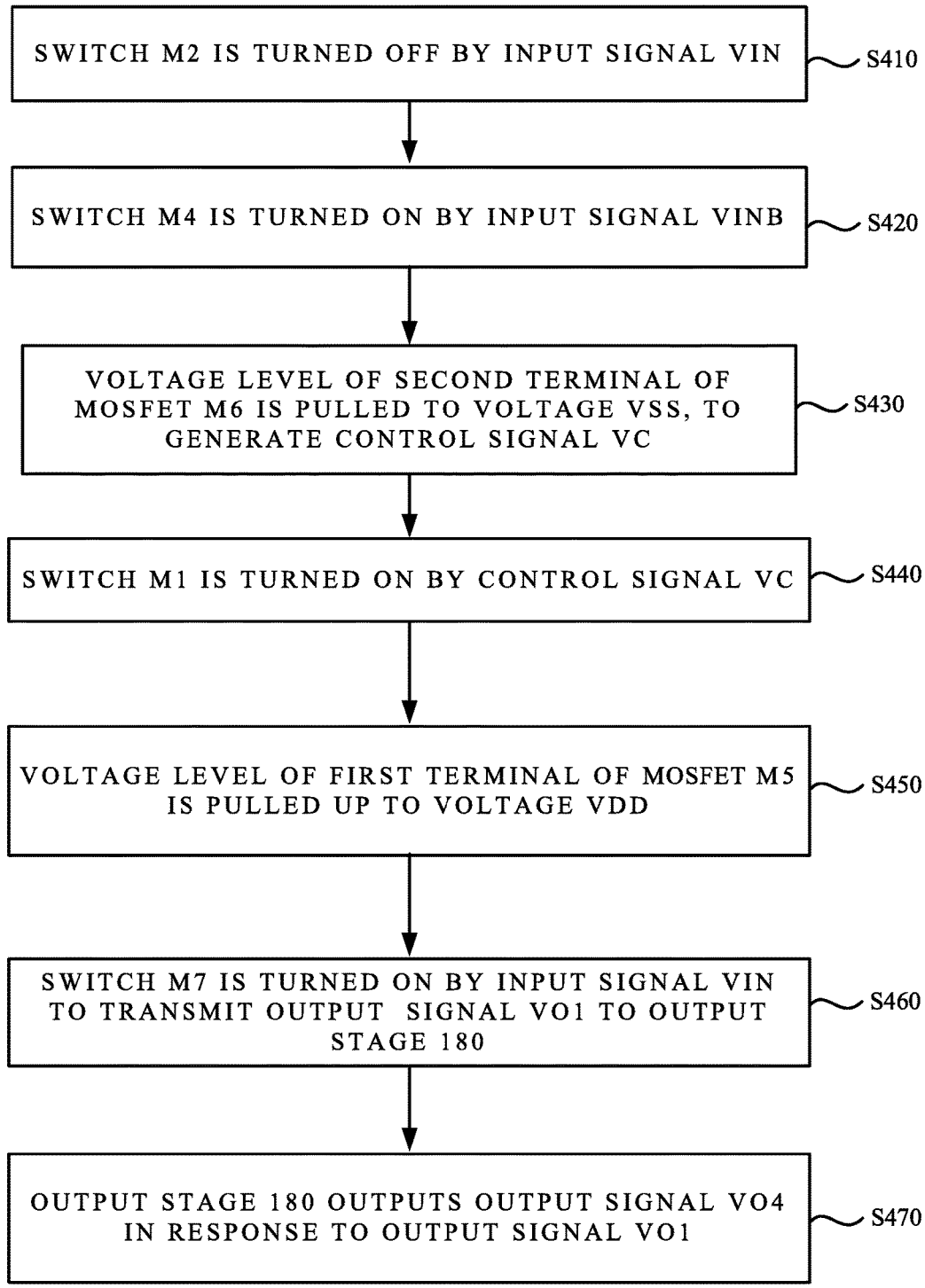
FIG. 4 is a flow chart of operations of the device in FIG. 2 when the input signal VIN has a logic value of 0, in accordance with various embodiments of the present disclosure.

Reference is now made to both of FIG. 2 and FIG. 4. FIG. 4 is a flow chart 400 of operations of the device 100 in FIG. 2 when the input signal VIN has the logic value of 0, in accordance with various embodiments of the present disclosure.

Alternatively, as shown in FIG. 4, operations of the device 100 in FIG. 2 are described with the input signal VIN having the logic value of 0. In operation S410, the switch M2 is turned off by the input signal VIN. In operation S420, the switch M4 is turned on by the input signal VINB. In operation S430, the voltage level of the second terminal of the MOSFET M6 is pulled to the voltage VSS, to generate the control signal VC. In operation S440, the switch M1 is turned on by the control signal VC. In operation S450, the voltage level of the first terminal of the MOSFET M5 is pulled up to the voltage VDDO. Accordingly, the output signal VO1 corresponding to the pulled up voltage level of the second terminal of the MOSFET M5 is generated. In operation S460, the switch M7 is turned on by the input signal VIN to transmit the output signal VO1 to the output stage 180. In operation S470, the output stage 180 outputs the output signal VO4 in response to the output signal vo1.

For illustration, as shown in FIG. 2, when the input signal VIN has the logic value of 0, the input signal VINB accordingly has the logic value of 1. The switch M2 is thus turned off by the input signal VIN. The switch M4 is thus turned on by the input signal VINB, to transmit the voltage VSS to the second terminal of the MOSFET M6. Accordingly, the voltage level of the second terminal of the MOSFET M6 is pulled down to the voltage VSS, to generate the control signal VC. The switch M1 is turned on by the control signal VC. Accordingly, the voltage level of the first terminal of the MOSFET M5 is pulled up to the voltage VDDO, to generate the output signal VO1 having the level of the voltage VDDO. The voltage level of the second terminal of the MOSFET M5 is then transited to the voltage VDDO-VTH5. The switch M7 is also turned on by the input signal VIN, to transmit the output signal VO1 to the output stage 180. As a result, the output stage 180 generates the output signal VO4 having the logic value of 0 according to the output signal VO2.

It is noted that, in the operations S410-S470 illustrated above, the diode-connected MOSFET M6 provides a voltage drop, i.e., a threshold voltage of the MOSFET M6, between the switches M3 and M4. In other words, the diode-connected MOSFET M6 effectively operates as a resistive device between the switches M3 and M4, to provide a resistance to reduce the current flowing from the switch M6 to the switch M2. With such arrangement, the current IM3 flowing from the switch M3 to the switch M4 is reduced. As a result, the pulling down operation of the switch M4 is able to be performed with a sub-threshold voltage.

In some embodiments, the operations illustrated in the flow chart 300 in FIG. 3 and the operations illustrated in the flow chart 400 in FIG. 4 are implemented as a level conversion method.

Figure 5:
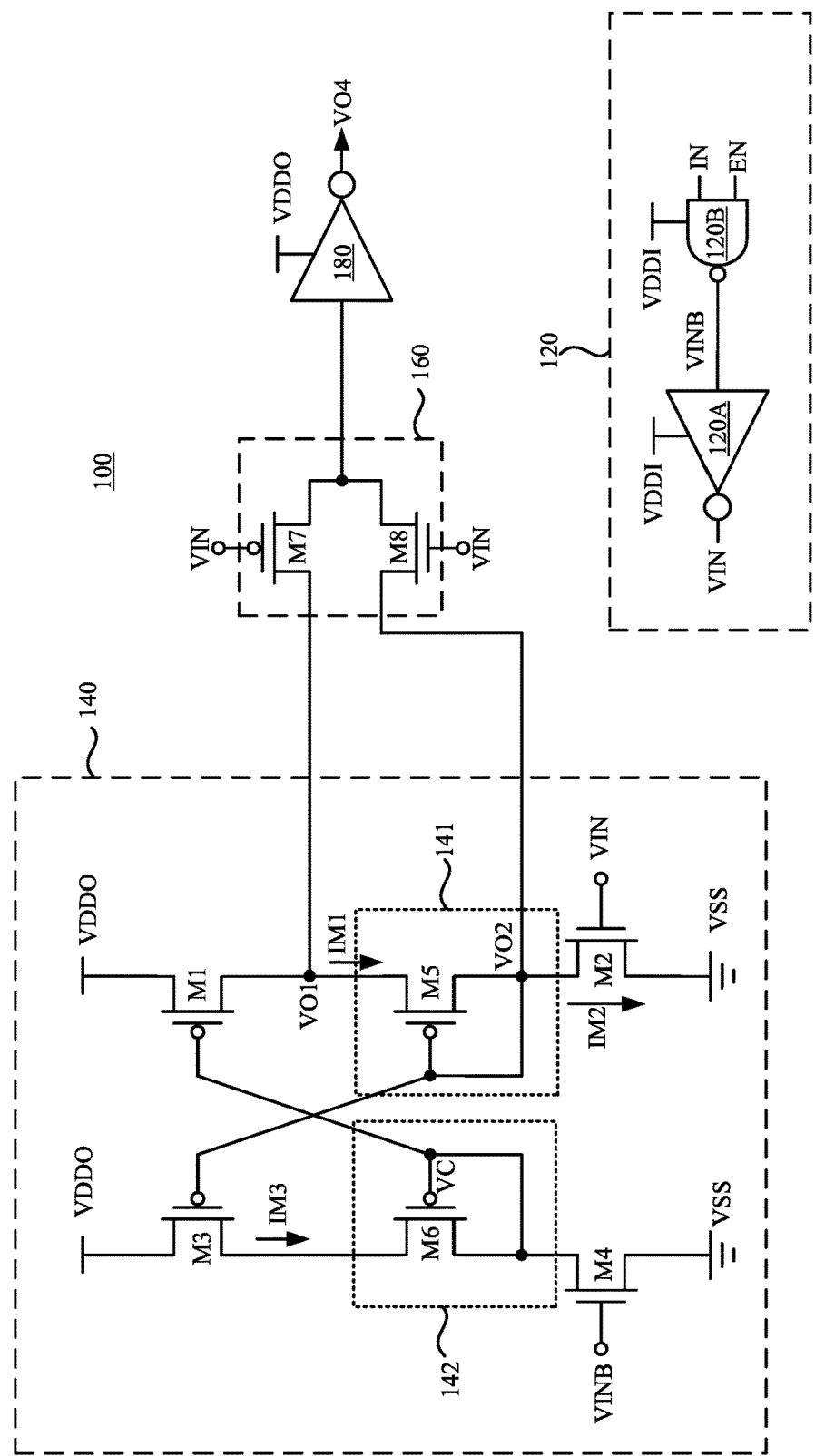
FIG. 5 is a circuit diagram of the device in FIG. 1, in accordance with various embodiments of the present disclosure.

Reference is now made to FIG. 5. FIG. 5 is a circuit diagram of the device 100 in FIG. 1, in accordance with various embodiments of the present disclosure.

Compared with the device 100 in FIG. 2, like elements in FIG. 5 are designated with the same reference numbers for ease of understanding. In some embodiments illustrated in FIG. 5, the input signal generator 120 of the device 100 further includes an NAND gate 120B. An output terminal of the NAND gate 120B is coupled to an input terminal of the inverter 120A. In some embodiments, the NAND gate 120B operates as an enabling unit of the input signal generator 120. For illustration, the NAND gate 120B is configured to receive an initial input signal IN and an enable signal EN, and output the input signal VINB to the inverter 120A according to the initial input signal IN and the enable signal EN. The inverter 120A is further configured to output the input signal VIN according to the input signal VINB.

When the initial input signal IN and the enable signal EN both have the logic value of 1, the input signal VINB has the logic value of 0. Accordingly, the input signal VIN has the logic value of 1. With such arrangements, the level shifter 140 is enabled to perform the level conversion for the input signal VIN, as discussed above, when the enable signal EN has the logic value of 1.

When the initial input signal IN has the logic value of 1 and the enable signal EN has the logic value of 0, the device 100 is disabled. In such a condition, the NAND gate 120B outputs the input signal VINB having the logic value of 1. The inverter 120A then outputs the input signal VIN having the logic value of 0. Accordingly, the switch M7 is turned on by the input signal VIN, to transmit the output signal VO1 having the logic value of 1 to the output stage 180, as discussed above in FIG. 4. As a result, the output stage 180 receives the output signal VO1 having the logic value of 1 and outputs the output signal VO4 having the logic value of 0. In other words, when the device 100 is disabled, the device 100 keeps outputting the output signal VO4 having the logic value of 0, instead of outputting a floating voltage.

In some embodiments, the NAND gate 120B and the inverter 120A operate with the voltage VDDI. In other words, both of the maximum voltage level of the input signals VIN and VINB and the maximum voltage level of the enable signal EN are set to the voltage VDDI.

Figure 6:
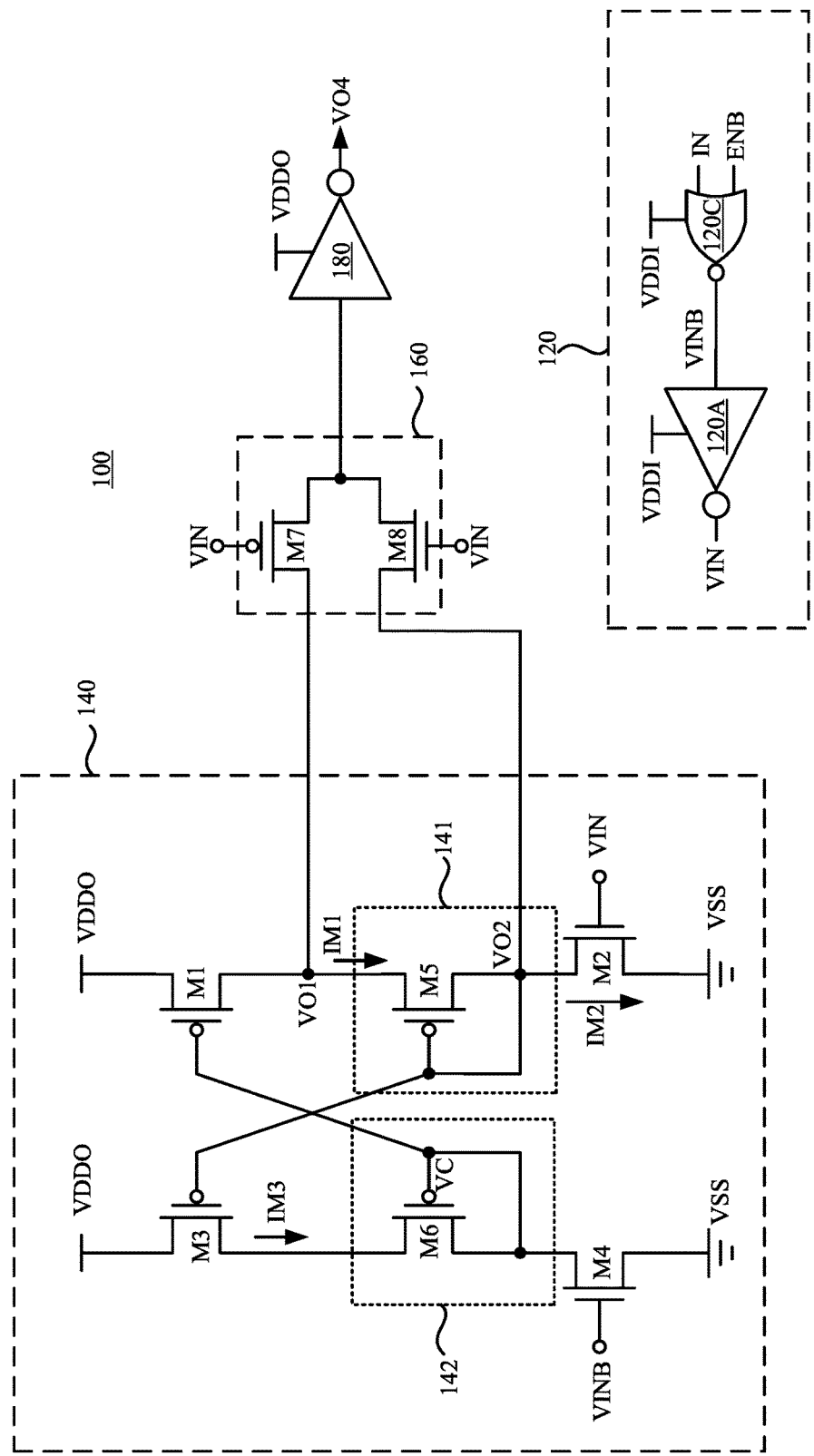
FIG. 6 is a circuit diagram of the device in FIG. 1, in accordance with various embodiments of the present disclosure.

Reference is now made to FIG. 6. FIG. 6 is a circuit diagram of the device 100 in FIG. 1, in accordance with various embodiments of the present disclosure.

Compared with the device 100 in FIG. 2, like elements in FIG. 6 are designated with the same reference numbers for ease of understanding. In some embodiments illustrated in FIG. 6, the input signal generator 120 of the device 100 further includes an NOR gate 120C. An output terminal of the NOR gate 120C is coupled to an input terminal of the inverter 120A. In some embodiments, the NOR gate 120C operates as an enabling unit of the input signal generator 120. For illustration, the NOR gate 120C is configured to receive the initial input signal IN and an enable signal ENB, and accordingly output the input signal VINB to the inverter 120A. The inverter 120A is configured to output the input signal VIN according to the input signal VINB. In some embodiments, the NOR gate 120C and the inverter 120A operate with the voltage VDDI.

Furthermore, compared with the device 100 in FIG. 5, in some embodiments illustrated in FIG. 6, the device 100 is enabled when the enable signal ENB has the logic value of 0. When the enable signal ENB has the logic value of 1, the NOR gate 120C outputs the input signal VINB having the logic value of 0. The inverter 120A thus generates the input signal VIN having the logic value of 1. As a result, the output stage 180 outputs the output signal VO4 having the logic value of 1. In other words, when the device 100 is disabled, the device 100 keeps outputting the output signal VO4 having the logic value of 1, instead of outputting a floating voltage.

The arrangements of the input signal generator 120 in FIGS. 5-6 are given for illustrative purposes. Various arrangements of the input signal generator 120 are within the contemplated scope of the present disclosure.

Figure 7:
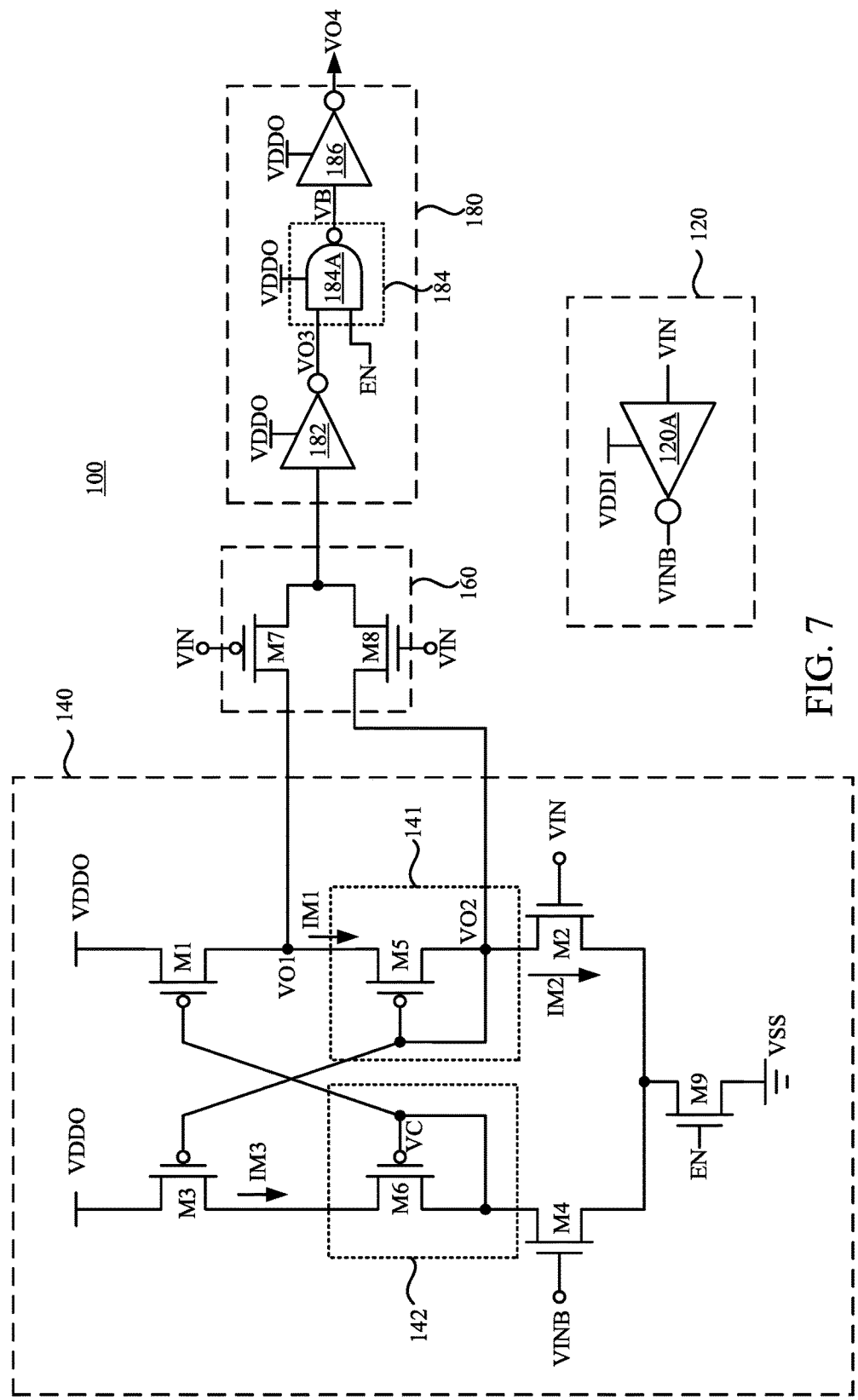
FIG. 7 is a circuit diagram of the device in FIG. 1, in accordance with various embodiments of the present disclosure.

Reference is now made to FIG. 7. FIG. 7 is a circuit diagram of the device 100 in FIG. 1, in accordance with various embodiments of the present disclosure.

Compared with the device 100 in FIG. 2, like elements in FIG. 7 are designated with the same reference numbers for ease of understanding. In some embodiments illustrated in FIG. 7, the level shifter 140 further includes a switch M9. A first terminal of the switch M9 is coupled to the second terminals of the switches M2 and M4, a second terminal of the switch M9 is configured to receive the voltage VSS, and a control terminal of the switch M9 is configured to receive the enable signal EN. The switch M9 is configured to be turned on according to the enable signal EN, so as to enable the switches M1-M6. In other words, in some embodiments, the switch M9 operates as an enabling unit of the level shifter 140.

Furthermore, compared with FIG. 2, in some embodiments illustrated in FIG. 7, the output stage 180 of the device 100 includes a buffer 182, a control circuit 184, and a buffer 186. An input terminal of the buffer 182 is coupled to the selector 160 to receive one of the output signal VO1 and the output signal VO2. The buffer 182 then outputs an output signal VO3 according to the one of the output signal VO1 and the output signal VO2. The control circuit 184 is coupled between the buffers 182 and 186. The control circuit 184 is configured to output a buffer signal VB according to the output signal VO3 and the enable signal EN. The buffer 186 is configured to output signal VO4 according to the buffer signal VB. In some embodiments, the control circuit 184 includes an NAND gate 184A. For illustration, as shown in FIG. 7, when the enable signal EN has the logic value of 1, the switch M9 is turned on to enable the switches M1-M6. In such condition, the logic value of the buffer signal VB is determined by the output signal VO3, as discussed above in FIGS. 3-4. When the output signal VO3 has the logic value of 1, the buffer signal VB has the logic value of 0. Alternatively, when the output signal VO3 has the logic value of 0, the buffer signal VB has the logic value of 1. When the enable signal EN has the logic value of 0, the switch M9 is turned off, and the switches M1-M6 are also turned off. Effectively, the level shifter 140 is disabled. In such condition, the NAND gate 184A outputs the buffer signal VB having the logic value of 1. As a result, the buffer 186 accordingly outputs the output level of the logic value of 0. With such arrangements, when the level shifter 140 is disabled, the device 100 keeps outputting the output signal VO4 having the value of 0, instead of outputting a floating voltage.

In some embodiments, the switch M9 and the output stage 180 operate with the voltage VDDO. In other words, the maximum voltage level of the enable signal EN is set to the voltage VDDO.

Figure 8:
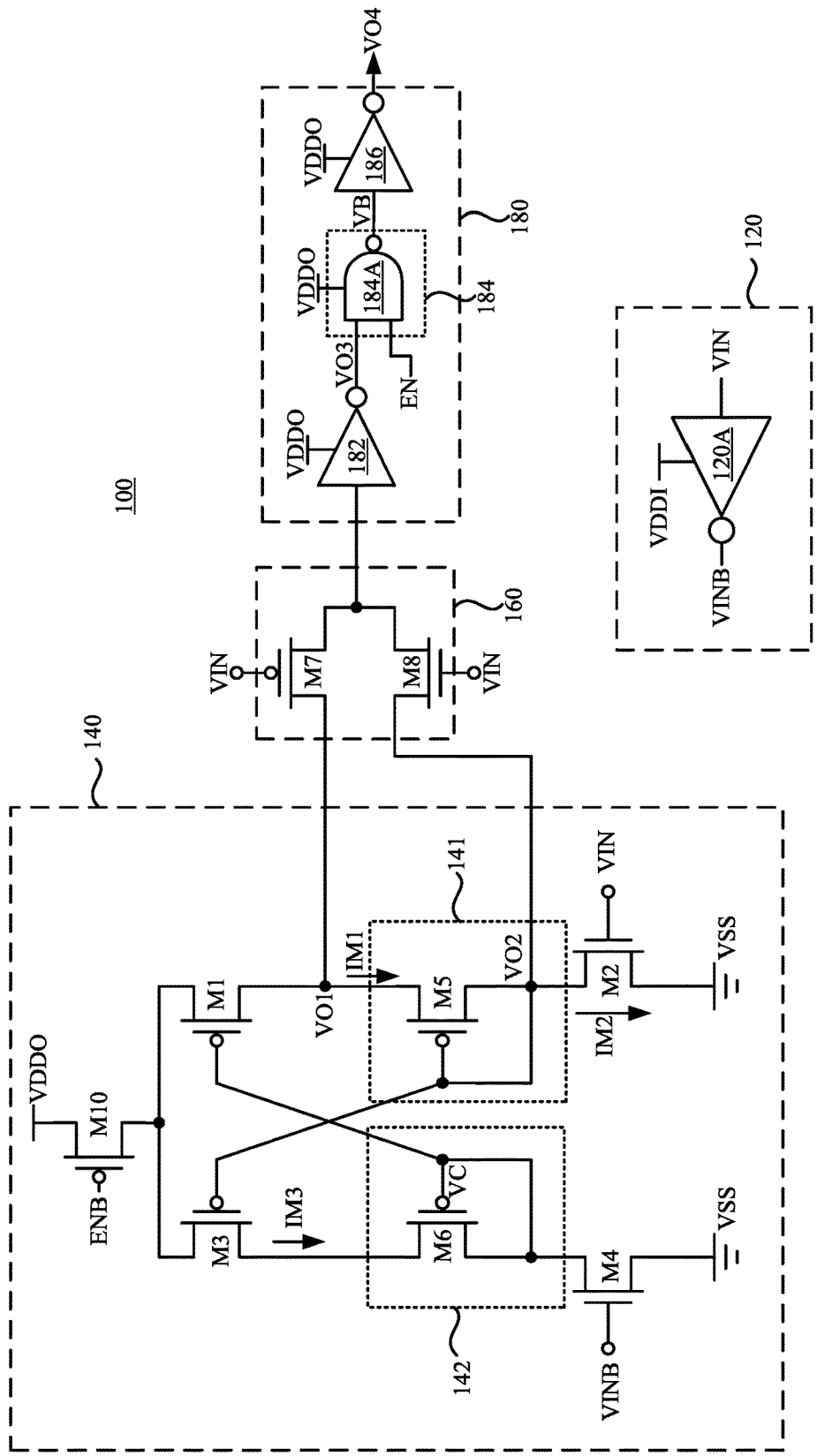
FIG. 8 is a circuit diagram of the device in FIG. 1, in accordance with various embodiments of the present disclosure.

Reference is now made to FIG. 8. FIG. 8 is a circuit diagram of the device 100 in FIG. 1, in accordance with various embodiments of the present disclosure.

Compared with the device 100 in FIG. 7, like elements in FIG. 8 are designated with the same reference numbers for ease of understanding. In some embodiments illustrated in FIG. 8, the switch M10 of the device 100 is coupled to the switches M1 and M3. In some embodiments, the first terminal of the switch M10 is configured to receive the voltage VDDO, the second terminal of the switch M10 is coupled to both of the first terminals of the switches M1 and M3, and the control terminal of the switch M10 is configured to receive the enable signal ENB. The switch M10 is configured to be turned on according to the enable signal ENB to enable the switches M1-M6. In some embodiments, the enable signal ENB is an inverse of the enable signal EN. For illustration, when the enable signal EN has the value of 1, the enable signal ENB has the value of 0. In such condition, the switch M10 is turned on to enable the switches M1-M6. The logic value of the buffer signal VB is determined according the one of the output signal VO1 and the output signal VO2 transmitted from the level shifter 140. Alternatively, when the enable signal EN has the logic value of 0, the enable signal ENB has the logic value of 1. In such condition, the switch M9 is turned off. Effectively, the level shifter 140 is disabled. As a result, the NAND gate 184A outputs the buffer signal VB having the logic value of 1, and the buffer 186 keeps outputting the output signal VO4 having the logic value of 0.

Figure 9:
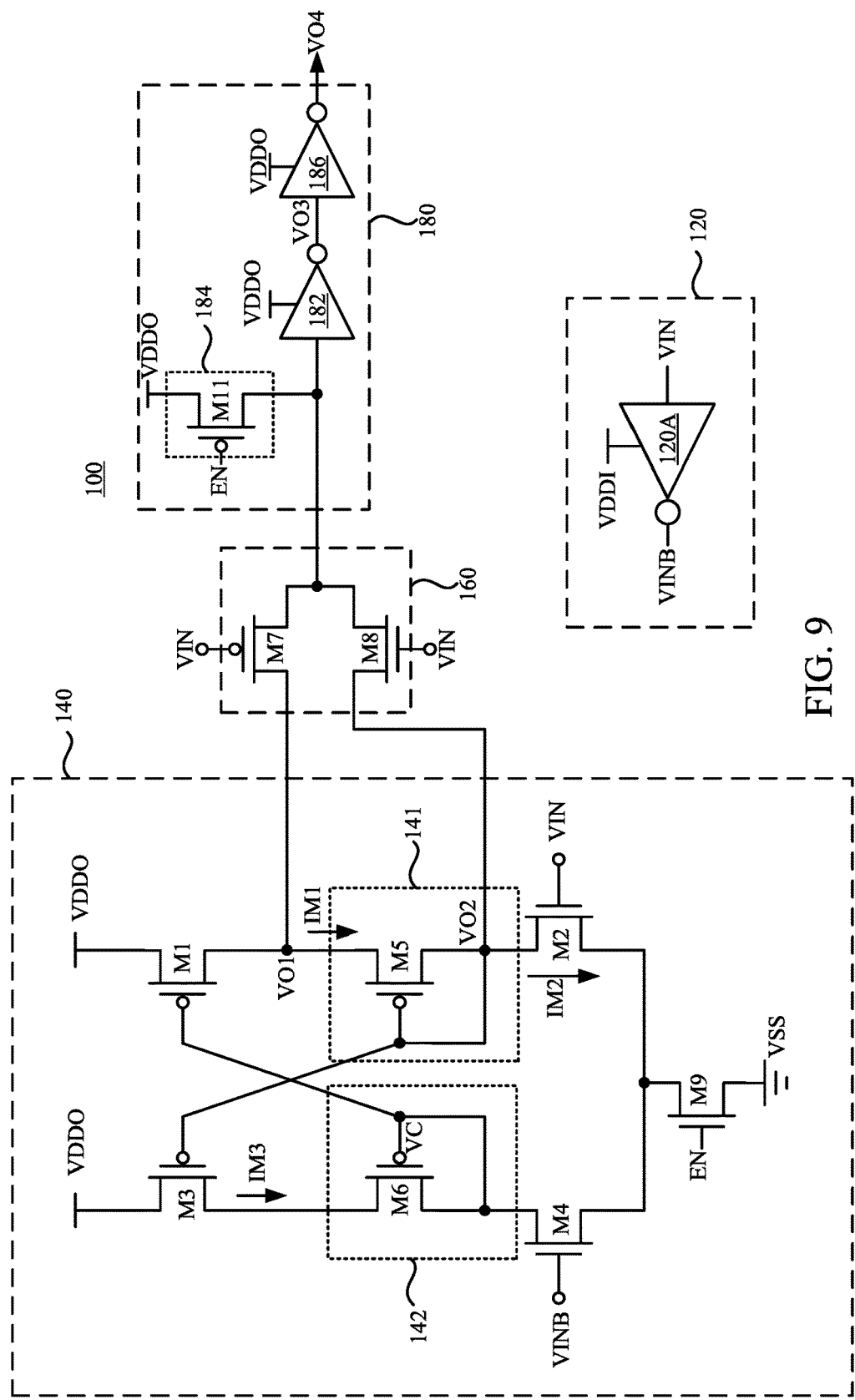
FIG. 9 is a circuit diagram of the device in FIG. 1, in accordance with various embodiments of the present disclosure.

Reference is now made to FIG. 9. FIG. 9 is a circuit diagram of the device 100 in FIG. 1, in accordance with various embodiments of the present disclosure.

Compared with the device 100 in FIG. 7, like elements in FIG. 9 are designated with the same reference numbers for ease of understanding. In some embodiments illustrated in FIG. 9, the control circuit 184 is coupled to an output terminal of the selector 160 and the buffer 182. The control circuit 184 is configured to transmit the voltage VDDO to the buffer 182 according to the enable signal EN. The buffer 182 is configured to receive one of the output signals VO1 and VO2, and the voltage VDDO, and accordingly output the output signal VO3. The buffer 186 is coupled to the buffer 182 to receive the output signal VO3, and outputs the output signal VO4 in response to the output signal VO3.

In some embodiments, the control circuit 184 includes a switch M11. A first terminal of the switch M11 is configured to receive the voltage VDDO, a second terminal of the switch M11 is coupled to the selector 160 to receive one of the output signals VO1 and VO2, and a control terminal of the switch M11 is configured to receive the enable signal EN. For illustration, when the enable signal has the logic value of 1, the switch M9 is turned on, and the switch M11 is turned off. Accordingly, the switches M1-M6 are enabled. As a result, the logic value of the output signal VO4 is determined according to the input signal VIN, as discussed above in FIGS. 3-4. Alternatively, when the enable signal EN has the logic value of 0, the switch M9 is turned off to disable the switches M1-M6. In such condition, the switch M11 is turned on by the enable signal EN, to transmit the voltage VDDO to the buffer 182. Effectively, the buffer 182 receives a signal having the logic value of 1. As a result, the buffer 186 outputs the output signal VO4 having the logic value of 1. With such arrangements, when the level shifter 140 is disabled, the device 100 keeps outputting the output signal VO4 having the logic value of 1, instead of outputting a floating voltage.

Figure 10:
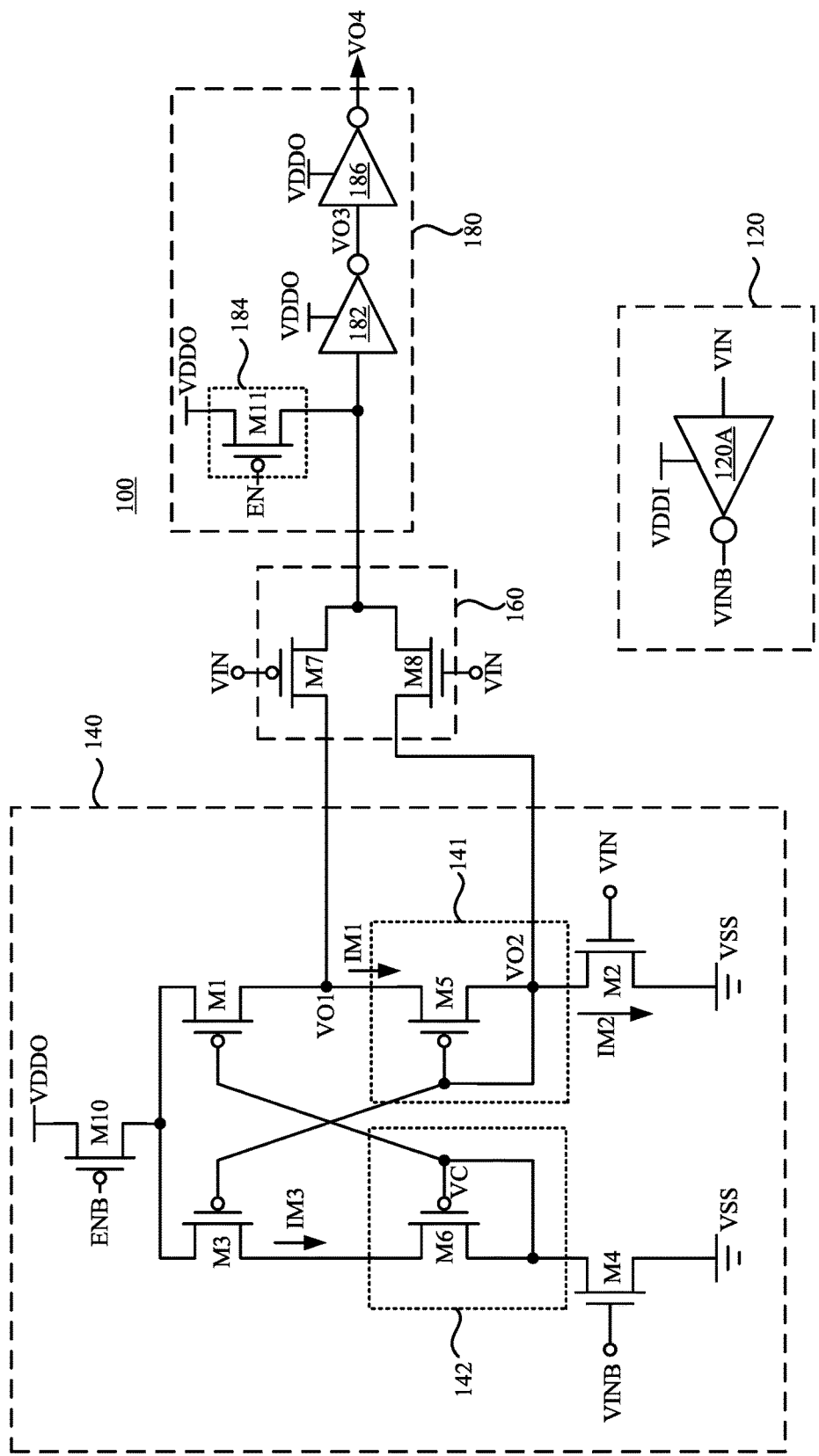
FIG. 10 is a circuit diagram of the device in FIG. 1, in accordance with various embodiments of the present disclosure.

Reference is now made to FIG. 10. FIG. 10 is a circuit diagram of the device 100 in FIG. 1, in accordance with various embodiments of the present disclosure.

Compared to the device 100 in FIG. 8 and FIG. 9, like elements in FIG. 10 are designated with the same reference numbers for ease of understanding. In some embodiments illustrated in FIG. 10, the control circuit 184 is coupled to an output terminal of the selector 160 and the buffer 182. The arrangement of the control circuit 184 in FIG. 10 is same as the arrangement of the control circuit 184 in FIG. 9. Thus, the related descriptions are not repeated here.

For illustration, as shown in FIG. 10, when the enable signal EN has the logic value of 1, the enable signal ENB has the logic value of 0. Accordingly, the switch M10 is turned on by the enable signal ENB, and the switch M11 is turned off by the enable signal EN. As a result, the switches M1-M6 are enabled, and the logic value of the output signal VO4 is determined according to the input signal VIN, as discussed above in FIGS. 3-4. Alternatively, when the enable signal EN has the logic value of 0, the enable signal ENB has the logic value of 1. Accordingly, the switch M10 is turned off by the enable signal ENB to disable the switches M1-M6, and the switch M11 is turned on by the enable signal EN to transmit the voltage VDDO to the buffer 182. As a result, the buffer 186 outputs the output signal VO4 having the logic value of 1.

As described above, the device 100 in the present disclosure is able to convert the sub-threshold voltage to a standard supply voltage for low-voltage circuits and systems. Moreover, the device 100 in the present disclosure is also able to convert the standard supply voltage the sub-threshold voltage according to practical applications. In other words, the device 100 in the present disclosure is able to operate with a wide voltage operation range.

In this document, the term "coupled" may also be termed as "electrically coupled," and the term "connected" may be termed as "electrically connected". "Coupled" and "connected" may also be used to indicate that two or more elements cooperate or interact with each other.

In some embodiments, a device is disclosed that includes a level shifter and a selector. The level shifter is configured to output a first output signal at a first output terminal in response to a first input signal having a first logic level, and is configured to output a second output signal at a second output terminal in response to the first input signal having a second logic level. The selector is coupled to the first output terminal and the second output terminal. The selector is configured to pass one of the first output signal or the second output signal in response to the first input signal, to an output of the selector.

Also disclosed is a device that includes a first transistor, a second transistor, a first current limiter, a third transistor, a fourth transistor, a second current limiter, a fifth transistor, and sixth transistor. The second transistor has a gate to receive a first input signal. The first current limiter is coupled to the first transistor at a first output terminal, and is coupled to the second transistor at a second output terminal. The third transistor has a gate coupled to the first current limiter. The fourth transistor has a gate to receive a first complementary input signal. The second current limiter is coupled between the third transistor and the fourth transistor, and the first transistor has a gate coupled to the second current limiter. The fifth transistor is coupled to the first current limiter at the first output terminal. The sixth transistor is coupled to the first current limiter at the second output terminal. When the first input signal has a first logic level, the first output terminal is configured to have a first output signal to be transmitted through the fifth transistor. When the first input signal has a second logic level, the second output terminal is configured to have a second output signal to be transmitted through the sixth transistor.

Also disclosed is a method that includes the operation below. In response to a first input signal having a first logic level, a level shifter generates a first output signal at a first terminal of a current limiter in the level shifter. In response to the first input signal having a second logic level, the level shifter generates a second output signal at a second terminal of the current limiter. When the first input signal has the first logic level, the first output signal is transmitted through a first switch turned on by the first input signal. When the first input signal has the second logic level, the second output signal is transmitted through a second switch turned on by the first input signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a level shifter configured to output a first output signal at a first output terminal in response to a first input signal having a first logic level, and configured to output a second output signal at a second output terminal in response to the first input signal having a second logic level; and
an output stage configured to receive and adjust the first output signal or the second output signal that is selected in response to the first input signal, and configured to generate a third output signal,
wherein the third output signal has a logic value that is the same as a logic value of the first output signal or the second output signal.

2. The device of claim 1, further comprising:
a selector coupled to an input terminal of the output stage and configured to transmit one of the first output signal or the second output signal in response to the first input signal.

3. The device of claim 2, wherein the selector further comprises:
a first transistor and a second transistor, wherein a terminal of the first transistor is coupled to a terminal of the second transistor, and the first input signal is received by a gate terminal of the first transistor and a gate terminal of the second transistor respectively.

4. The device of claim 1, wherein the output stage further comprises:
a control circuit configured to transmit a voltage with a logic value in response to a first enable signal; and
a first buffer coupled to the control circuit, and configured to receive the voltage and to generate a fourth output signal having a logic value that is the same as the logic value of the voltage.

5. The device of claim 4, wherein the output stage further comprises:
a second buffer coupled to the first buffer, and configured to generate the third output signal according to the fourth output signal.

6. The device of claim 1, wherein the level shifter comprises:
a first current limiter;
a first pulling-up unit configured to pull up a voltage level of a first terminal of the first current limiter, to generate the first output signal; and
a first pulling-down unit configured to pull down a voltage level of a second terminal of the first current limiter, to generate the second output signal.

7. The device of claim 6, wherein the level shifter comprises:
a second current limiter;

a second pulling-up unit configured to pull up a voltage level of a first terminal of the second current limiter according to the second output signal, to generate a control signal; and
a second pulling-down unit configured to pull down a voltage level of a second terminal of the second current limiter according to a second input signal, wherein the second input signal is an inverse of the first input signal.

8. The device of claim 7, wherein the level shifter further comprises:
an enabling unit configured to enable the level shifter according to a second enable signal, wherein the enabling unit is coupled to the first pulling-up unit and the second pulling-up unit.

9. The device of claim 7, wherein the level shifter further comprises:
an enabling unit configured to enable the level shifter according to a first enable signal, wherein the enabling unit is coupled to the first pulling-down unit and the second pulling-down unit.

10. The device of claim 1, further comprising:
a logic gate configured to perform an NOR operation of an second enable signal and an initial signal, in order to generate a second input signal; and
an inverter configured to generate the first input signal according to the second input signal.

11. A device, comprising:
a first switch and a second switch configured to operate between a first voltage level with a first logic value and a second voltage level with a second logic value,
a third switch coupled to the first switch at a first terminal of the third switch and the second switch at a second terminal of the third switch, and configured to provide a threshold voltage between the first terminal and the second terminal of the third switch in order to enable the device, and
a fourth switch and a fifth switch coupled to the first terminal and the second terminal of the third switch respectively,
wherein the first switch and the fourth switch are further configured to be turned on to transmit a first output signal with the first voltage level generated at the first terminal of the third switch in response to a first logic value of an input signal, and
the second switch and the fifth switch are further configured to be turned on to transmit a second output signal with the second voltage level generated at the second terminal of the third switch in response to a second logic value of the input signal.

12. The device of claim 11, further comprising:
an output stage coupled to the fourth switch and the fifth switch,
wherein the output stage is configured to receive the first output signal transmitted through the fourth switch or the second output signal transmitted through the fifth switch.

13. The device of claim 12, wherein the output stage comprises:
a first inverter, wherein a input terminal of the first inverter is coupled to a terminal of the fourth switch and a terminal of the fifth switch, and the first inverter is configured to generate a third output signal in response to one of the first output signal or the second output signal; and
a second inverter coupled to an output terminal of the first inverter, and configured to generate a fourth output signal in response to the third output signal, the fourth output signal being inverted from the third output signal.

14. The device of claim 13, wherein the output stage further comprises:
a logic gate configured to perform an NAND operation of an enable signal and the third output signal, in order to generate a buffer signal.

15. The device of claim 12, wherein the output stage comprises:
an inverter coupled to a terminal of the fourth switch and a terminal of the fifth switch, and configured to operate with the first voltage level and to pull a voltage swing of one of the first output signal and the second output signal.

16. The device of claim 12, wherein the output stage comprises:
a pull-up unit configured to pull up a voltage level of the first output signal transmitted through the fourth switch or the second output signal transmitted through the fifth switch.

17. The device of claim 12, wherein
the first switch, the second switch, the fourth switch and the fifth switch are selectively turned on or turned off in response to the input signal in order to output a third output signal having the first voltage level or the second voltage level through the output stage.

18. A method, comprising:
providing a voltage drop by a first current limiter between a first switch and a second switch, in a level shifter,
adjusting, by the level shifter, a voltage level of an input signal to generate a first output signal having a first logic value and a second output signal having a second logic value at two terminals of the first current limiter, respectively; and
adjusting, by a output stage, a voltage swing of the first output signal or the second output signal selected by a selector to generate a third output signal,
wherein the third output signal has a logic value that is the same as a logic value of the first output signal or the second output signal.

19. The method of claim 18, wherein adjusting the voltage level comprises:
pulling up a maximum voltage level of the input signal from a first voltage to a second voltage,
wherein the first voltage is different from the second voltage.

20. The method of claim 18, wherein adjusting the voltage swing comprises:
when the input signal has the first logic value, buffering, by a first buffer of the output stage, the first output signal being pulled up, to generate the third output signal; and
when the input signal has the second logic value, buffering, by the first buffer of the output stage, the second output signal being pulled up, to generate the third output signal.

* * * * *